(12) United States Patent
Ohmori (10) Patent No.: US 6,956,412 B2
(45) Date of Patent: Oct. 18, 2005

(54) HIGH-VOLTAGE INPUT TOLERANT RECEIVER

(75) Inventor: Tadashi Ohmori, Shiga (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,599

(22) Filed: May 17, 2004

(65) Prior Publication Data

US 2004/0227556 A1 Nov. 18, 2004

(30) Foreign Application Priority Data

May 15, 2003 (JP) ............................. 2003-137848

(51) Int. Cl.[7] .............................................. H03B 1/00
(52) U.S. Cl. ........................ 327/108; 327/391; 326/83
(58) Field of Search ........................ 327/108–112, 170, 327/379, 389, 391, 309, 310, 312, 313, 317, 327/318, 319, 323, 327, 328, 333; 326/23–24, 326/26, 27, 80–83

(56) References Cited

U.S. PATENT DOCUMENTS 5,966,026 A * 10/1999 Partovi et al. ................ 326/27
6,441,670 B1 * 8/2002 Coughlin et al. ........... 327/323
6,724,226 B2 * 4/2004 Kim ........................... 327/108
6,897,688 B2 * 5/2005 Lee et al. .................... 327/112

FOREIGN PATENT DOCUMENTS

JP  2000-278113  6/2000

* cited by examiner

Primary Examiner—Long Nguyen
(74) Attorney, Agent, or Firm—Michael J. LeStrange (57) ABSTRACT

A high-voltage input tolerant receiver capable of achieving power savings with less distortion of analog signals is disclosed. When an external signal φC input from a PAD 2 is less than 3.6V, a p-channel MOS transistor P10 is turned off. As a result, a control signal φE becomes 0V to turn on a p-channel MOS transistor P1. At this time, an intermediate signal φD output from a clamp circuit 3 becomes equivalent to the external signal φC, and is not distorted. However, when the external signal φC exceeds 3.6V, the p-channel MOS transistor P10 is turned on, and a control signal φF output from a differential amplifier 9 becomes 0V. As a result, the p-channel MOS transistor P1 is turned off, and a level keeper 6 is enabled. Since the level keeper 6 remains inactive until the external signal exceeds 3.6V, current flowing through the level keeper 6 can be reduced.

9 Claims, 5 Drawing Sheets

HIGH-VOLTAGE INPUT TOLERANT RECEIVER

BACKGROUND OF INVENTION

1. Field of the Invention

This invention relates to a high-voltage input tolerant receiver, and more particularly, to a high-voltage input tolerant receiver, which receives an external signal varying between ground and a high voltage limit of the internal elements of the receiver, and outputs an internal signal varying between ground and just below the high voltage limit of the internal elements of the receiver.

2. Background of the Invention

Figure 3:
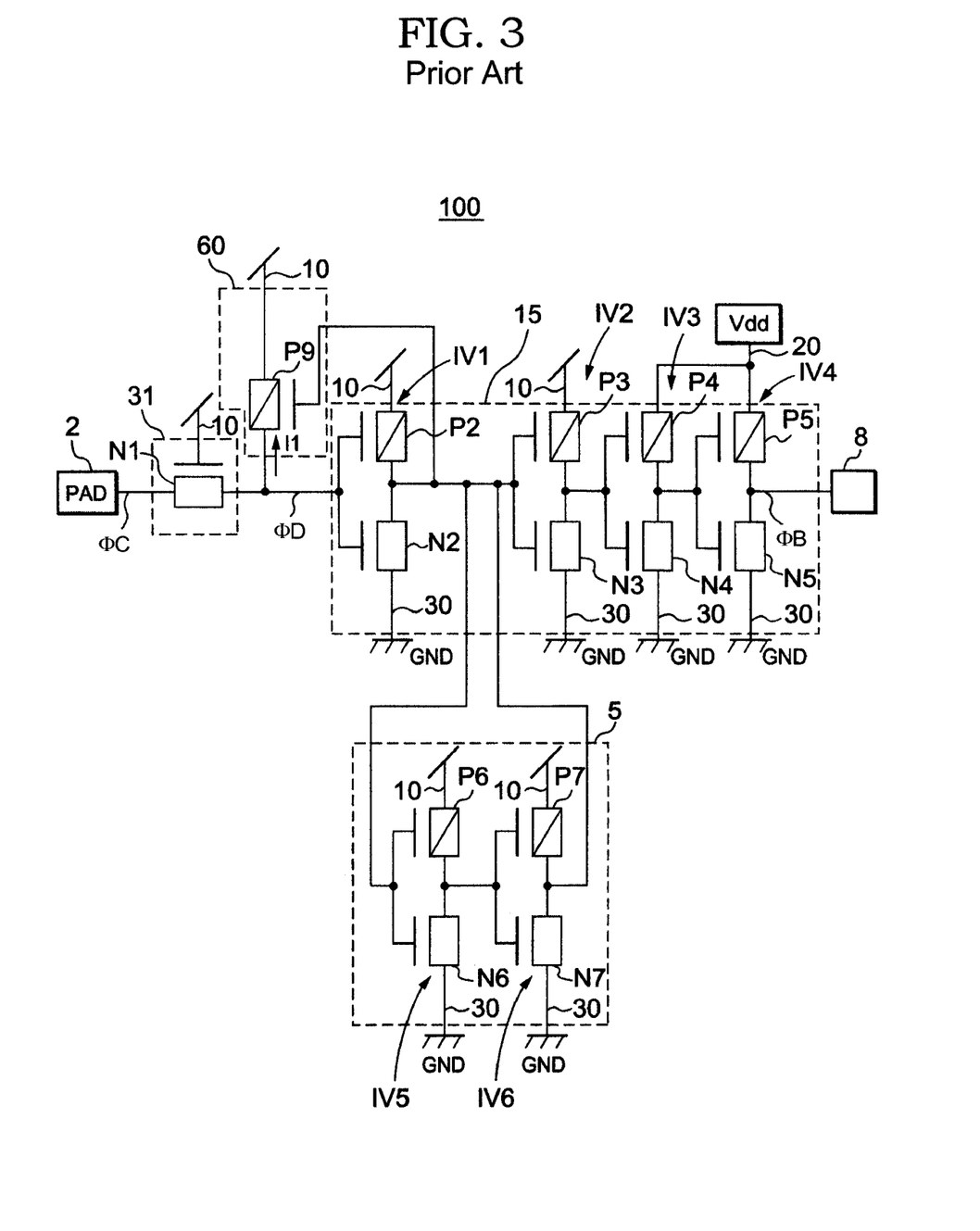
FIG. 3 illustrates a circuit diagram showing the general structure of a conventional high-voltage input tolerant receiver.

There is a high-voltage input tolerant receiver as shown in FIG. 3 used as an interface from a 5 V driving element to 3.3 V driving element. Referring to FIG. 3, a conventional high-voltage input tolerant receiver 100 includes a PAD 2, a clamp circuit 31, a level keeper 60, a buffer circuit 15, and a hysteresis circuit 5. The clamp circuit 31, connected between the output node of the PAD 2 and the input node of an inverter IV1 in the buffer circuit 15, has an n-channel MOS transistor N1 with its gate connected to a 3.3 V power-supply potential node 10. The level keeper 60 has a p-channel MOS transistor P9. The p-channel MOS transistor P9, connected between the 3.3 V power-supply potential node 10 and the input node of the inverter IV1, receives at its gate an output signal from the inverter IV1. In the buffer circuit 15, inverters IV1 to IV4 are connected in series so that an internal signal φB will be output from the inverter IV4.

When an external signal φC input from PAD 2 is less than 3.3 V−$V_{thN1}$, the clamp circuit 31 outputs an intermediate signal φD equivalent to the external signal φC, where $V_{thN1}$ is a threshold voltage of the n-channel MOS transistor N1. Conversely, when the external signal φC exceeds 3.3 V−$V_{thN1}$, the clamp circuit 31 clamps the intermediate signal φD to 3.3 V−$V_{thN1}$, which prevents the internal elements of the high-voltage input tolerant receiver 100 from being damaged or destroyed by high voltage signals.

When the intermediate signal φD is clamped to 3.3 V−$V_{thN1}$, the p-channel MOS transistor P9 in the level keeper 60 is turned on, pulling the intermediate signal φD input to the inverter IV1 up to 3.3 V, which prevents shoot-through current from flowing into the inverter IV1.

Figure 4:
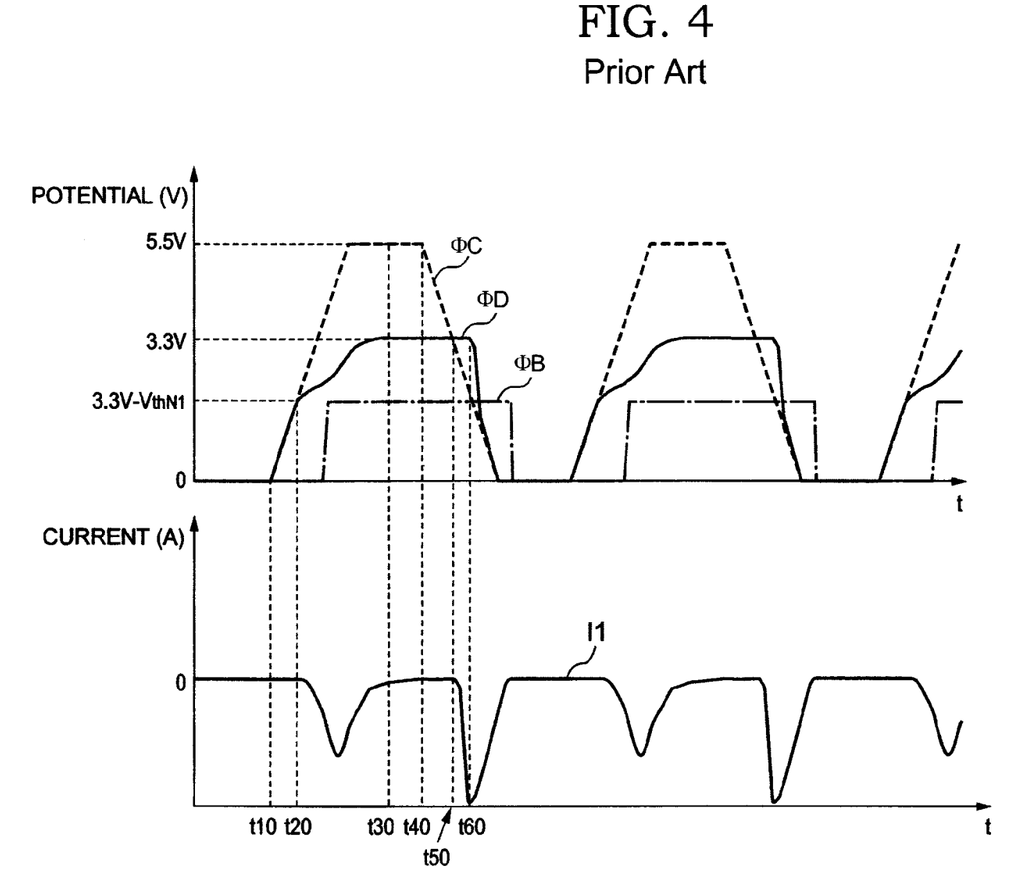
FIG. 4 illustrates a timing chart showing the operation of the high-voltage input tolerant receiver shown in FIG. 3.

FIG. 4 shows variations of the intermediate signal φD and internal signal φB, and variations of current I1 flowing from the level keeper 60 as the external signal φC varies from 0 V to 5.5 V.

Referring to FIG. 4, the external signal φC varies from 0 V to 3.3 V during the period from time t10 to time t20. During this period, the intermediate signal φD output from the clamp circuit 31 is equivalent to the external signal φC. After time t20, the external signal φC exceeds 3.3 V−$V_{thN1}$, and the clamp circuit 31 clamps the intermediate signal φD to 3.3 V−$V_{thN1}$. Since the potential difference between the clamped intermediate signal φD and the ground potential GND exceeds a threshold voltage V $thN_2$ of an n-channel MOS transistor N2, current flows into the n-channel MOS transistor N2 in the inverter IV1 to turn on the n-channel MOS transistor N2, allowing the inverter IV1 to output a 0 V signal. At this time, since the potential difference between the 0 V output signal from the inverter IV1 and the 3.3 V power-supply potential exceeds a threshold voltage $V_{thP9}$ of the p-channel MOS transistor P9, the p-channel MOS transistor P9 is turned on. As a result, the level keeper 60 pulls up the intermediate signal φD, and at time t30, the intermediate signal φD becomes 3.3 V. After the intermediate signal φD is pulled up to 3.3 V, only the n-channel MOS transistor N2 in the inverter IV1 is in operation, thereby preventing the shoot-through current.

Then, after time t40, the level of the external signal φC is reduced, and at time t50, although it becomes lower than that of the intermediate signal φD, since the level keeper 60 is active, the intermediate signal φD is maintained at 3.3 V. Ultimately, at time t60, at which point the level keeper 60 goes beyond being tolerant of the voltage drop of the external signal φC, the p-channel MOS transistor P9 is turned off, and the voltage level of the intermediate signal φD becomes equal to that of the external signal φC just after time t60.

The high-voltage input tolerant receiver 100 uses the clamp circuit 31 to protect the 3.3 V driving elements and the level keeper 60 to prevent the occurrence of shoot-through current in the inverter IV1. Such a high-voltage input tolerant receiver 100, however, causes the following problems.

(1) Analog signals are distorted in the high-voltage input tolerant receiver.

In the high-voltage input tolerant receiver 100, when the external signal φC is higher than 3.3 V−$V_{thN1}$, the intermediate signal φD is clamped to 3.3 V−$V_{thN1}$. In this case, the intermediate signal φD does not accord with the external signal φC, creating distortion. When the external signal φC is a digital signal distortion is not a concern, but for analog signals the distortion can be significant.

(2) The reset function does not work in a reset circuit using the high-voltage input tolerant receiver.

Figure 5:
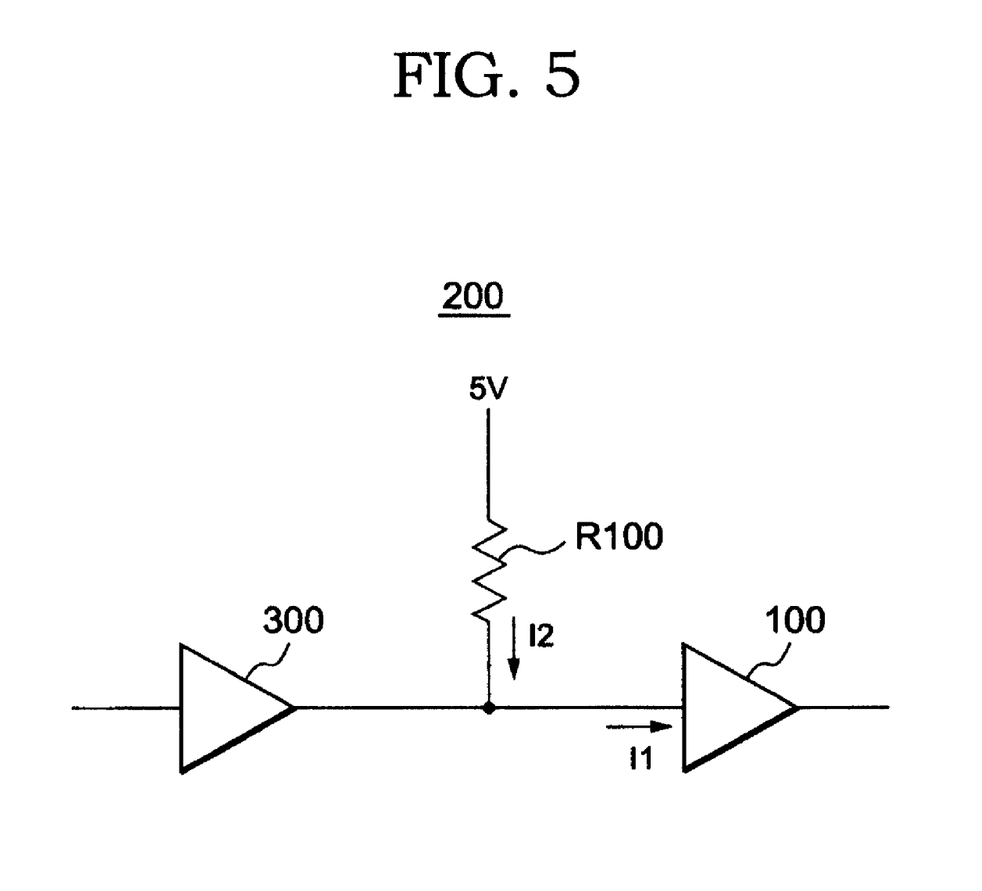
FIG. 5 illustrates a circuit diagram showing the general structure of a reset circuit.

In a reset circuit 200 shown in FIG. 5, when a driver 300 has low drive power, even if a logic Low level signal is output from the driver 300, it will not become a perfect 0 V signal. Since the high-voltage input tolerant receiver 100 has the hysteresis circuit 5, the high-voltage input tolerant receiver 100 will evaluate whether any input signal is at a logic high level unless the input signal into the high-voltage input tolerant receiver 100, that is, the external signal φC, becomes equal to or lower than a logic low level threshold voltage Vil interpreted by the hysteresis circuit 5. As a result, the level keeper 60 continues to operate so that the high-voltage input tolerant receiver 100 will continuously output the logic high signal without being reset. This problem arises when sink current flowing into the driver 300 is smaller than the sum of current I2 flowing into a pull-up resistor R100 and current I1 flowing from the level keeper 60 in the high-voltage input tolerant receiver 100.

(3) Unnecessary current I1 flows from the level keeper 60. Current I1 flows from the level keeper 60 to the outside during the period from time t20 to time t30 and after time t60 in FIG. 4 and causes unnecessary power consumption.

Japanese Patent Laid-Open No. 2000-278113 discloses an example of an input/output circuit with the above described deficiencies with respect to distortion of analog signals and power dissipation.

SUMMARY OF INVENTION

It is an object of the invention to provide a high-voltage input tolerant receiver capable of reducing the distortion of analog signals.

It is another object of the invention to provide a high-voltage input tolerant receiver capable of achieving power savings.

According to the invention, a high-voltage input tolerant receiver is disclosed that receives an external signal varying between ground and a high voltage limit of the internal elements of the receiver and outputs an internal signal varying between ground and just below the high voltage limit of the internal elements of the receiver. The high-voltage input tolerant receiver includes a pad, a control circuit, a first clamp circuit, a level keeper circuit, and a buffer circuit. The pad receives the external signal. The control circuit receives the external signal input from the pad, and outputs a first control signal and a second control signal when the external signal is higher than a first voltage. The first clamp circuit receives the external signal input from the pad, outputs an intermediate signal equivalent to the external signal, and clamps the intermediate signal to a second voltage lower than the first voltage when receiving the first control signal. The level keeper circuit pulls the intermediate signal up to a third voltage equal to or lower than the first voltage when receiving the second control signal. The buffer circuit receives the intermediate signal and outputs the internal signal.

In the high-voltage input tolerant receiver according to the invention, when the external signal is lower than the first voltage, i.e. equal to or lower than the high voltage limit of the internal elements, the control circuit does not output the first and second control signals. At this time, the level keeper circuit is not active, and the first clamp circuit outputs the external signal input from the pad as the intermediate signal. Thus, when the external signal is equal to or lower than the first electric potential, even if the external signal is an analog signal, it is not distorted in the high-voltage input tolerant receiver.

However, when the external signal is higher than the first voltage, the intermediate signal is input to the buffer circuit after being clamped to the second voltage by the first clamp circuit and pulled up to the third voltage by the level keeper circuit. Thus, even an external signal in excess of the high voltage limit of the internal elements of the receiver is input to the high-voltage input tolerant receiver the internal elements are not damaged because the intermediate signal input into the buffer circuit is equal to or less than the high voltage limit of the internal elements. Further, since the first clamp circuit is enabled when the external signal becomes higher than the first voltage, the amount of current flowing through the level keeper circuit can be reduced, thereby reducing the power consumption of the high-voltage input tolerant receiver.

Preferably, the first clamp circuit includes a first n-channel transistor and a first p-channel transistor. The first n-channel transistor having a gate to receive the third voltage, which corresponds to a defined input/output standard voltage. The first p-channel transistor, connected in parallel with the first n-channel transistor, has a gate to receive the first control signal.

When the external signal is equal to or lower than the first voltage and less than a threshold voltage of the first p-channel transistor, the first p-channel transistor is turned off. However, since the value that is the result of the subtraction of the source voltage (external signal) from the gate voltage of the first n-channel transistor is larger than a threshold voltage of the first n-channel transistor, the first n-channel transistor is fully turned on. Conversely, when the external signal exceeds the threshold voltage of the first p-channel transistor, since the value that is the result of the subtraction of the gate voltage from the source voltage (external signal) of the first p-channel transistor also exceeds the threshold, the first p-channel transistor is fully turned on.

It is apparent from the above-mentioned results that when the external signal is equal to or lower than the first voltage, either of the first n-channel transistor and the first p-channel transistor remains in the ON state, and therefore the intermediate signal becomes equal to the external signal.

Further, when the external signal is higher than the first voltage, the first p-channel transistor receives the first control signal at its gate. As a result, the first p-channel transistor is turned off. Then, since the intermediate signal is clamped to the second voltage by the first n-channel transistor, the buffer circuit does not receive any signal higher than the first voltage, thereby preventing the internal elements of the high-voltage input tolerant receiver from being destroyed.

Preferably, the buffer circuit includes inverters to receive the intermediate signal, and the level keeper circuit includes a second p-channel transistor and a third p-channel transistor. The second p-channel transistor has a source to receive the third voltage and a gate to receive the second control signal. The third p-channel transistor, connected between the drain of the second p-channel transistor and the output node of the first clamp circuit, has a gate to receive an output signal from the inverters.

In this case, when the external signal voltage is higher than the first voltage, the second p-channel transistor is turned on in response to receiving the second control signal, and further the third p-channel is turned on. As a result, the level keeper circuit pulls the intermediate signal clamped to the second voltage up to the third voltage. Conversely, when the external signal is less than the first voltage, the second p-channel transistor is turned off, and the level keeper circuit is not active. As a result, the amount of current in the level keeper circuit is reduced compared to prior art solutions, and enables a reduction in power consumption of the high-voltage input tolerant receiver as compared to prior art receiver circuits.

Preferably, the control circuit includes a switch, a second clamp, and a differential amplifier circuit. The switch outputs the first control signal equivalent to the external signal when the external signal is higher than the first voltage. The second clamp circuit holds the first control signal lower than the first voltage when receiving the first control signal. The differential amplifier circuit receives the clamped first control signal and outputs the second control signal.

In this case, the switch does not output the first control signal until the external signal becomes higher than the first voltage. Then, when the external signal becomes higher than the first voltage, the switch outputs the first control signal equivalent to the external signal to the first clamp circuit so that the first clamp circuit can hold the external signal at the second voltage as soon as the external signal becomes higher than the first voltage.

The second clamp circuit receives and clamps the first control signal to the second voltage, and outputs the clamped signal to the differential amplifier circuit. The differential amplifier circuit does not receive any signal higher than the first voltage, thereby preventing the internal elements from being destroyed.

The differential amplifier circuit receives the first control signal clamped by the second clamp circuit, and outputs the second control signal. It allows the level keeper circuit to operate only when the voltage of the external signal is higher than the first voltage, and hence it can reduce the amount of current flowing in the level keeper circuit.

DETAILED DESCRIPTION

Referring to the accompanying drawings, an embodiment of the invention will now be described in detail. In the drawings, identical or equivalent portions are given the same reference numerals to invoke the same descriptions.

Figure 1:
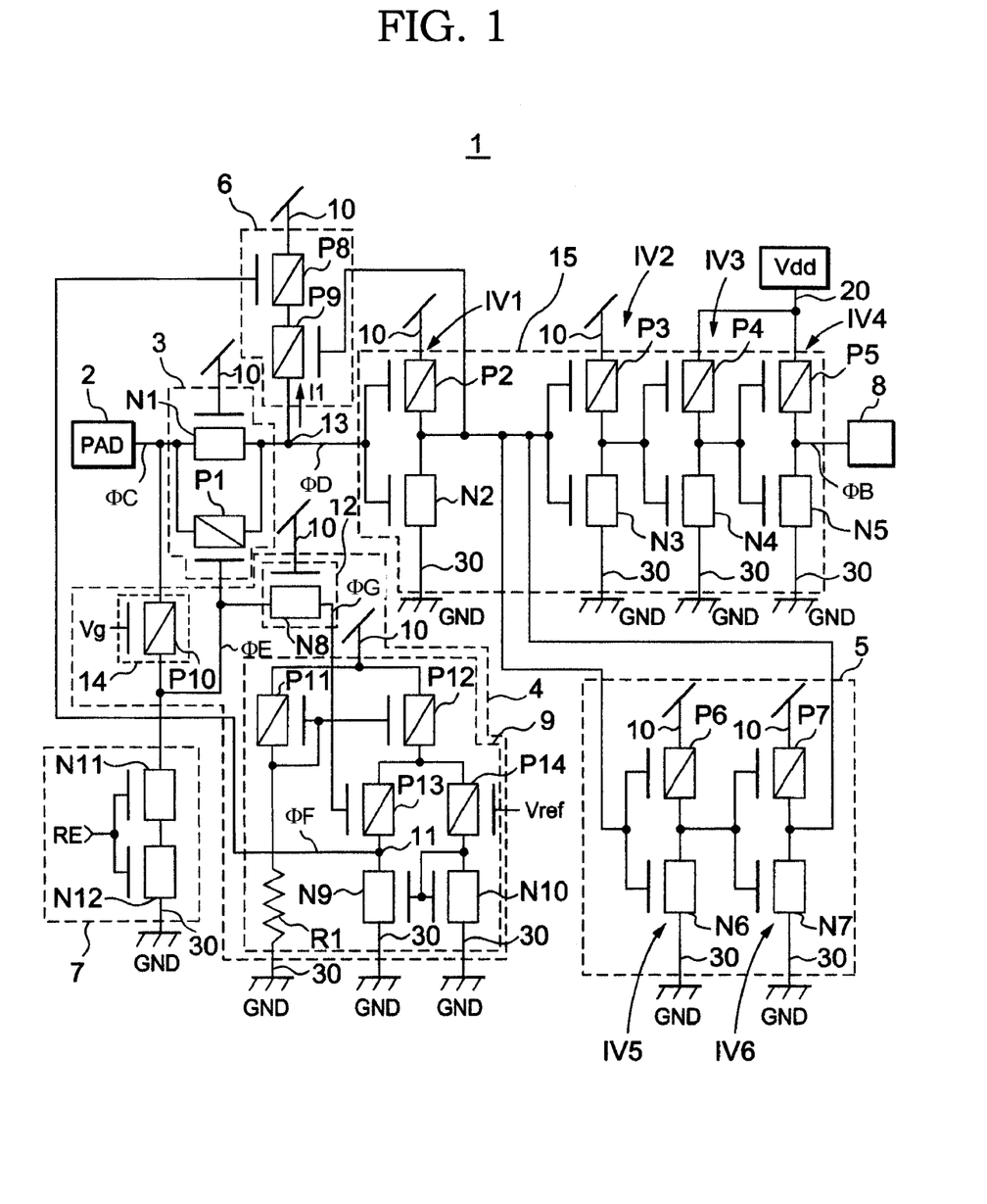
FIG. 1 illustrates a circuit diagram showing the general structure of a high-voltage input tolerant receiver according to an embodiment of the invention.

Structure of High-Voltage Input Tolerant ReceiverReferring to FIG. 1, a high-voltage input tolerant receiver 1 includes a pad 2, a clamp circuit 3, a level keeper 6, a control circuit 4, an operating circuit 7, a hysteresis circuit 5, a buffer circuit 15, and an output node 8.

The clamp circuit 3 is connected between the pad 2 and the input node of the buffer circuit 15. The clamp circuit 3 includes an n-channel MOS transistor N1 and a p-channel MOS transistor P1. The n-channel MOS transistor N1 and the p-channel MOS transistor P1 are connected in parallel. The gate of the n-channel MOS transistor N1 is connected to a 3.3 V power-supply potential node 10. The gate of the p-channel MOS transistor P1 is connected to the control circuit 4. The clamp circuit 3 receives an external signal φC input from PAD 2 and outputs an intermediate signal φD.

The control circuit 4 includes a switch circuit 14, a clamp circuit 12, and a differential amplifier circuit 9. The switch circuit 14 includes a p-channel MOS transistor P10. The p-channel MOS transistor P10, connected between the pad 2 and the operating circuit 7, receives a voltage Vg at its gate. The switch circuit 14 receives the external signal φC and outputs a control signal φE. When the external signal φC exceeds 3.6 V, the p-channel MOS transistor P10 is turned on to make the control signal φE equivalent to the external signal φC. The voltage Vg is so set that the p-channel MOS transistor P10 is turned on when the external signal φC exceeds 3.6 V. If the threshold voltage of the p-channel MOS transistor P10 is 1.64 V, the voltage Vg will be set to 1.96 V. The control signal φE is output to the clamp circuit 12 and the gate of the p-channel MOS transistor P1 in the clamp circuit 3.

The clamp circuit 12 includes an n-channel MOS transistor N8. The n-channel MOS transistor N8, connected between the switch circuit 14 and the gate of a p-channel MOS transistor P13, receives a signal from the 3.3 V power-supply potential node 10. The clamp circuit 12 receives the control signal φE and outputs a signal φG. When the control signal φE is larger than 3.3 V–$V_{thN8}$, the clamp circuit 12 clamps the signal φG to $V_{thN8}$ where 3.3 V–$V_{thN8}$ is a threshold voltage of the n-channel MOS transistor N8.

The differential amplifier circuit 9 includes p-channel MOS transistors P11 to P14, n-channel MOS transistors N9 and N10, and a resistor element R1. The p-channel MOS transistors P11, P12, and the resistor element R1 form a constant current generator. The p-channel MOS transistors P11 and P12 form a current mirror. The sources of the p-channel MOS transistors P11 and P12 are both connected to the 3.3 V power-supply potential node 10. The resistor R1 is connected between the drain of the p-channel MOS transistor P11 and a ground potential node 30. The sources of the p-channel MOS transistors P13 and P14 are both connected to the drain of the p-channel MOS transistor P12. The n-channel MOS transistor N9 is connected between the p-channel MOS transistor P13 and the ground potential node 30, while the n-channel MOS transistor N10 is connected between the p-channel MOS transistor P14 and the ground potential node 30. The n-channel MOS transistors N9 and N10 form a current mirror. The gate of the p-channel MOS transistor P14 receives a reference potential Vref (=1.65 V), while the gate of the p-channel MOS transistor P13 receives the output signal φG from the clamp circuit 12. The differential amplification circuit 9 outputs a control signal φF from its output node 11.

The buffer circuit 15 includes inverters IV1 to IV4. The inverters IV1 to IV4 are connected in series between the clamp circuit 3 and the output node 8. The inverter IV1 includes a p-channel MOS transistor P2 and an n-channel MOS transistor N2, which are connected in series between the 3.3 V power-supply potential node 10 and the ground potential node 30. The inverter IV2 includes a p-channel MOS transistor P3 and an n-channel MOS transistor N3, which are connected in series between the 3.3 V power-supply potential node 10 and the ground potential node 30. The inverter IV3 includes a p-channel MOS transistor P4 and an n-channel MOS transistor N4, which are connected in series between an internal power-supply potential Vdd node 20 and the ground potential node 30. The inverter IV4 includes a p-channel MOS transistor P5 and an n-channel MOS transistor N5, which are connected in series between the internal power-supply potential Vdd node 20 and the ground potential node 30. The inverter IV4 outputs an internal signal φB to the output node 8.

The level keeper 6 includes p-channel MOS transistors P8 and P9 connected in series. The source of the p-channel MOS transistor P8 is connected to the 3.3 V power-supply potential node 10, and the gate thereof receives the control signal φF output from the control circuit 4. The drain of the p-channel MOS transistor P9 is connected with the output node of the clamp circuit 3 and the input node of the inverter IV1, and the gate thereof receives an output signal from the inverter IV1.

The hysteresis circuit 5 is a circuit provided to reduce noise. The hysteresis circuit 5 includes inverters IV5 and IV6 connected in series. The operating circuit 7, also shown in FIG. 1 is a circuit for actuating the high-voltage input tolerant receiver 1. The operating circuit 7 includes n-channel MOS transistors N11 and N12 to whose gates a receiver enable signal RE for activating the high-voltage input tolerant receiver 1 is input.

Figure 2:
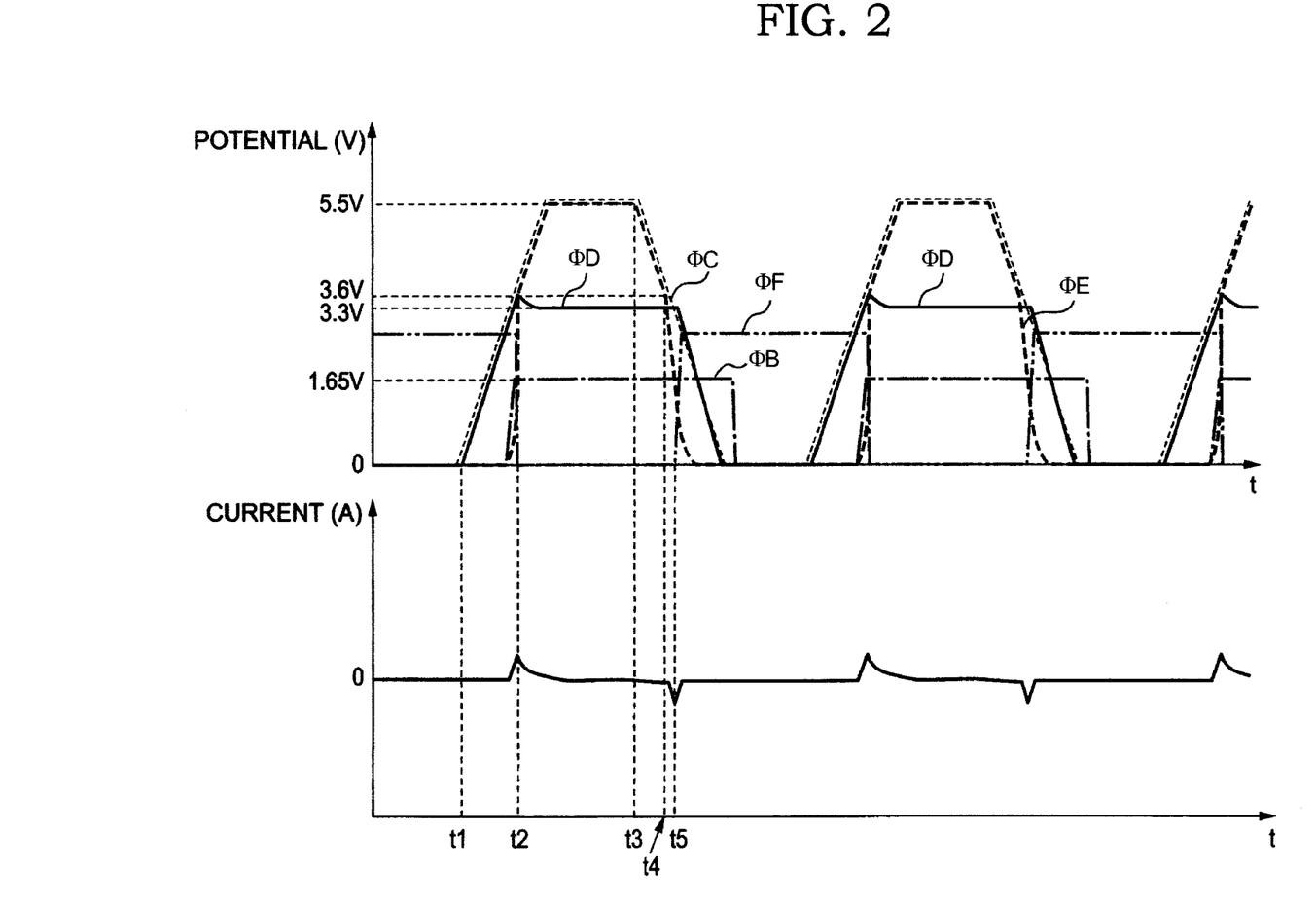
FIG. 2 illustrates a timing chart corresponding to the operation of the high-voltage input tolerant receiver shown in FIG. 1.

Operation of the High-Voltage Input Tolerant ReceiverReferring next to FIG. 2, the operation of the high-voltage input tolerant receiver 1 is described when the external signal φC is periodically varied from 0 to 5.5 V. Note that during operation the receiver enable signal RE input to the operating circuit 7 is a logic high, which enables the high-voltage input tolerant receiver 1.

At time t1, the external signal φC input from the pad 2 is 0 V.

The clamp circuit 3 outputs the intermediate signal φD of 0 V that is equivalent to the external signal φC. Specifically, in the clamp circuit 3, the result of the subtraction of the source voltage (=external signal φC) from the gate voltage (3.3 V) of the n-channel transistor N1 is larger than a threshold voltage $V_{thN1}$ of the n-channel transistor N1. Therefore, the n-channel transistor N1 is fully turned on, and the output signal (=intermediate signal φD) becomes 0 V which is identical to the voltage of the external signal φC at time t0. The switch circuit 14 outputs the control signal φE which is equal to 0 V at time t0. In the switch circuit 14, the result of the subtraction of the gate voltage Vg (=1.96 V) from the source voltage (φC =0 V) of the p-channel MOS transistor P10 becomes smaller than a threshold voltage V (=1.64 V) of the p-channel MOS transistor P10. Thus, since the p-channel MOS transistor P10 is in the OFF state and the n-channel MOS transistors N11 and N12 are in the ON state, the control signal φE output from the p-channel MOS transistor P10 is 0 V. The gate of the n-channel MOS transistor N8 in the control circuit 4 is tied to 3.3 V and receives the 0 V control signal φE at its source. As a result, since the gate-source voltage exceeds the threshold voltage $V_{thN8}$ of the n-channel MOS transistor N8, the n-channel MOS transistor N8 is fully turned on, and the signal φG output from the n-channel MOS transistor N8 becomes 0 V, which is identical to the voltage of the control signal φE a time t0. In the differential amplifier circuit 9, the gate of p-channel MOS transistor P13 receives the signal φG of 0 V. Since the voltage of the signal φG is smaller than the reference voltage Vref (=1.65 V), the control signal φF output from the output node 11 becomes high (=3.3 V). Upon receipt of the logic high control signal φF, since the p-channel MOS transistor P8 is turned off, the level keeper 6 is not active. During the period from time t1 to time t2 when the external signal φC becomes 3.6 V, the external signal φC increases its voltage at a constant rate per unit time. During this period, since the external signal φC remains less than 3.6 V, the result of the subtraction of the gate voltage Vg (=1.96 V) from the source voltage (external signal φC) of the p-channel MOS transistor P10 does not exceed the threshold voltage $V_{thp10}$(=1.64 V). Therefore, the p-channel MOS transistor P10 remains in the OFF state, and the control signal φE remains at 0 V. Upon receipt of the signal φE of 0 V, the clamp circuit 12 outputs the signal φG of 0 V. Since the differential amplifier circuit 9 receives the signal φG of 0 V, it outputs the logic high control signal φF. Then, since the level keeper 6 receives the logic high control signal φF, it remains inactive. During the period from time t1 to time t2, the intermediate signal φD output form the clamp circuit 3 becomes equivalent to the external signal φC. Specifically, when the external signal φC is less than the threshold voltage $V_{thP1}$ of the p-channel MOS transistor P1, the p-channel MOS transistor P1 is turned off, but since the gate-source voltage (=3.3 V-external signal φC) of the n-channel MOS transistor N1 is larger than the threshold voltage $V_{thN1}$, the n-channel MOS transistor N1 is fully turned on. However, when the external signal φC exceeds the threshold voltage $V_{thP1}$, since the result of the subtraction of the gate voltage (=control signal φE=0 V) from the source voltage (=external signal φC) of the p-channel MOS transistor P1 exceeds the threshold $V_{thP1}$, the p-channel MOS transistor P1 is fully turned on. From the above results, it is found that either the n-channel MOS transistor N1 or the p-channel MOS transistor P1 remain in the ON state in the clamp circuit 3 during the period from time t1 to time t2. Therefore, since the intermediate signal φD becomes equivalent to the external signal φC, the external signal φC is not distorted in the high-voltage input tolerant receiver 1 even though it is an analog signal. After time t2, the external signal φC exceeds 3.6 V. At this time, since the result of the subtraction of the gate voltage Vg (=1.96 V) from the source voltage (=external signal φC) in the p-channel MOS transistor P10 exceeds the threshold voltage $V_{thP10}$ (=1.64 V), the p-channel MOS transistor P10 is fully turned on to make the control signal φE equivalent to the external signal φC. In the clamp circuit 3, the p-channel MOS transistor P1 receives the external signal φC at its source and the control signal φE equivalent to the external signal φC at its gate. Therefore, the p-channel MOS transistor P1 is turned off. On the other hand, since the n-channel MOS transistor N1 receives the external signal φC at its drain and 3.3 V at its gate, it outputs a signal clamped to 3.3 V-$V_{thN1}$. As a result, the intermediate signal φD output from the clamp circuit 3 is clamped to 3.3 V-$V_{thN1}$. However, as will be described later, since the intermediate signal φD is pulled up to 3.3 V by the level keeper 6, the intermediate signal φD clamped to 3.3 V-$V_{thN1}$ does not appear in FIG. 2 until immediately after time t2. In the control circuit 4, since the gate of n-channel MOS transistor N8 is tied to 3.3 V and the drain is coupled to control signal φE, the signal φG is clamped to 3.3 V-$V_{thN8}$. Since the clamp circuit 12 clamps the signal φG, it does not output the signal φG at a level higher than the upper voltage limit to the p-channel MOS transistor P13 of the differential amplifier circuit 9. Therefore, the reliability of the gate oxide film of the p-channel MOS transistor P13 can be secured, protecting the differential amplifier circuit 9 from being damaged or destroyed. Upon receipt of the signal φG of 3.3 V-$V_{thN8}$, the differential amplifier circuit 9 outputs a logic low (0 v) control signal φF from output node 11. In the level keeper 6, since the gate of p-channel MOS transistor P8 receives the control signal φF of 0 V and the source is tied to 3.3 V, the result of the subtraction of the gate voltage from the source voltage exceeds the threshold voltage $V_{thP8}$. Therefore, the p-channel MOS transistor P8 is fully turned on. On the other hand, the gate of p-channel MOS transistor P9 receives the output signal from the inverter IV1. The output signal of the inverter IV1 has been 0 V since the external signal φC exceeded the threshold voltage $V_{thN2}$ of the n-channel MOS transistor N2 after time t1. Therefore, the gate of p-channel MOS transistor P9 receives the output signal of 0 V at time t2, and is turned on. Thus, since the p-channel MOS transistors P8 and P9 are both turned on, the level keeper 6 pulls the intermediate signal φD up to 3.3 V. According to the above-described operation, after the external signal φC exceeds 3.6 V, the intermediate signal φD is fixed at 3.3 V. At this time, although current I1 flows from the node 13 to the level keeper 6, the amount of current I1 can be significantly less than in the conventional level keeper 60. This is because the level keeper 6 is active only when the external signal φC exceeds 3.6 V, rather than when the output signal of the inverter IV1 is a logic low. After time t3, the external signal φC decreases from 5.5 V at a constant rate per unit time. After time t4, the external signal φC becomes equal to or less than 3.6 V and the result of the subtraction of the gate voltage Vg from the source voltage (external signal φC) of the p-channel MOS transistor P10 becomes smaller than the threshold $V_{thP10}$. Therefore, the p-channel MOS transistor P10 is turned off to cause a rapid voltage drop of the control signal φE. Then, when the result of the subtraction of the gate voltage (control signal φE) from the source voltage (external signal φC) of the p-channel MOS transistor P1 exceeds the threshold voltage $V_{thP1}$, the p-channel MOS transistor P1 is turned on again. As a result, the intermediate signal φD output from the clamp circuit 3 becomes equivalent to the external signal φC again. Since the gate-source voltage of the n-channel MOS transistor N8 in the control circuit 4 becomes larger than the threshold $V_{thN8}$, the output signal φG is equivalent to the control signal φE. At time t5, signal φG becomes lower than the reference voltage Vref (=1.65 V) and the differential amplifier circuit 9 outputs the control signal φF of 3.3 V. At this time, since the result of the subtraction of the gate voltage (3.3 V) from the source voltage (3.3 V) of the p-channel MOS transistor P8 in the level keeper 6 becomes zero, that is, smaller than the threshold voltage $V_{thP8}$, the p-channel MOS transistor P8 is turned off. In other words, since the level keeper 6 stops pulling up the intermediate signal φD, the intermediate signal φD becomes equivalent to the external signal φC. Although current I1 flows from the level keeper 6 to the node 13 until the level keeper 6 is disabled, the amount of current is substantially lower than in prior art receiver circuits because the operation of the level keeper 6 is stopped at time t5. PARA0In the embodiment, based on the assumption that the voltage limit of the internal elements of the high-voltage input tolerant receiver 1 is 3.6 V, the gate voltage Vg is set to 1.96 V so that the p-channel MOS transistor P10 in the control circuit 4 will be fully turned on when the external signal φC exceeds 3.6 V. This is to prevent the internal elements from being destroyed from a high voltage external signal φC larger than the limit of the internal elements of the high-voltage input tolerant receiver 1. Therefore, even if the withstand voltage of the internal elements is any value, other than 3.6 V, the gate voltage Vg of the p-channel MOS transistor P10 may be determined based on the voltage limit of the internal elements of the high-voltage input tolerant receiver 1. Another value may be substituted for the 3.3 V power-supply provided it is lower than the voltage limit of the internal elements. PARA0While the invention has been described in detail, the foregoing description is in all aspects illustrative and not restrictive. It is understood that numerous other modifications and variations can be devised without departing from the scope of the invention.

What is claimed is:

1. A high-voltage input tolerant receiver adapted to receive an external signal varying between a ground potential and a defined voltage limit for the receiver, the receiver being designed to output an internal signal varying between the ground potential and a voltage less than the defined voltage limit for the receiver, comprising:
    a pad which receives the external signal;
    a control circuit that receives the external signal from the pad and outputs a first control signal and a second control signal when the external signal is higher than a first voltage;
    a first clamp circuit that receives the external signal from the pad, outputs an intermediate signal equivalent to the external signal, and clamps the intermediate signal to a second voltage lower than the first voltage in response to receiving the first control signal;
    a level keeper circuit that pulls the intermediate signal up to a third voltage less than or equal to the first voltage in response to receiving the second control signal; and
    a buffer circuit that receives the intermediate signal and outputs the internal signal.

2. A high-voltage input tolerant receiver according to claim 1, wherein the first clamp circuit includes:
    a first n-channel transistor receiving the external signal and having a gate coupled to the third voltage, and
    a first p-channel transistor connected in parallel with the first n-channel transistor and having a gate coupled to the first control signal.

3. A high-voltage input tolerant receiver according to claim 1, wherein
    the buffer circuit includes a plurality of inverters coupled in series to receive and propagate the intermediate signal,
    the level keeper circuit includes a second p-channel transistor with a source coupled to the third voltage and a gate to receive the second control signal, and
    a third p-channel transistor connected between the drain of the second p-channel transistor and an output node of said first clamp circuit that provides said intermediate signal and having a gate to receive an output signal from one of the plurality of inverters.

4. A high-voltage input tolerant receiver according to claim 1, wherein the control circuit includes:
    a switch that outputs the first control signal equivalent to the external signal when the external signal is higher than the first voltage,
    a second clamp circuit that clamps the first control signal to a voltage lower than the first voltage in response to receiving the first control signal, and
    a differential amplifier circuit that receives the clamped first control signal and outputs the second control signal.

5. A high-voltage input tolerant receiver according to claim 4, wherein the switch includes a fourth p-channel transistor having a source to receive the external signal, the fourth p-channel transistor being turned on when the external signal is higher than the first voltage.

6. A high-voltage input tolerant receiver according to claim 4 or 5, wherein said second clamp circuit includes a second n-channel transistor receiving the first control signal and having a gate to receive the third voltage.

7. A method of reducing distortion of an external signal in a high voltage input tolerant receiver, the method comprising:
    providing a pad to receive the external signal;
    providing a control circuit that receives the external signal from the pad and outputs a first control signal and a second control signal when the external signal is higher than a first voltage;
    providing a first clamp circuit to receive the external signal from the pad, outputs an intermediate signal equivalent to the external signal, and clamps the intermediate signal to a second voltage lower than the first voltage in response to receiving the first control signal;
    providing a level keeper circuit to pull the intermediate signal up to a third voltage less than or equal to the first voltage in response to receiving the second control signal; and
    providing a buffer circuit to receive the intermediate signal and outputs an internal signal.

8. The method according to claim 7, further comprising:
    disabling the control circuit from outputting the first control signal and the second control signal when the external signal is lower than the first voltage;
    disabling the level keeper circuit when the external signal is equal to or lower than the first voltage; and
    enabling the first clamp circuit to output the external signal from the pad as the intermediate signal.

9. The method according to claim 7, wherein power dissipation of the high-voltage input tolerant receiver is reduced by fixing the intermediate signal at a defined input/output standard voltage when the external signal exceeds a specified input voltage limit for the receiver and enabling the level keeper circuit only when the external signal exceeds the specified input voltage limit for the receiver.

* * * * *